United States Patent [19]

Barnhart

[11] 4,156,841
[45] May 29, 1979

[54] CONTACT FINGERS FOR A TESTING APPARATUS FOR SURFACE INSULATION RESISTIVITY

[75] Inventor: Herbert D. Barnhart, Erie, Pa.
[73] Assignee: General Electric Company, Erie, Pa.
[21] Appl. No.: 860,818
[22] Filed: Dec. 15, 1977
[51] Int. Cl.² .......................... G01R 31/16; G01R 1/06
[52] U.S. Cl. .................................. 324/54; 324/65 CP; 324/158 P
[58] Field of Search ................ 324/51, 54, 53, 65 CP, 324/65 P, 72.5, 73 PC, 133, 149, 158 F, 158 P; 339/108 TP

[56] References Cited

U.S. PATENT DOCUMENTS

| | | | |
|---|---|---|---|
| 1,881,457 | 10/1932 | Froeckman | 324/53 X |
| 2,204,136 | 6/1940 | King et al. | 324/53 X |
| 3,369,175 | 2/1968 | Morris | 324/51 X |
| 3,537,000 | 10/1970 | Easi | 324/72.5 |
| 3,559,056 | 1/1971 | Easi | 324/72.5 |
| 3,596,177 | 7/1971 | Butera | 324/72.5 X |

OTHER PUBLICATIONS

Franklin, R. F., "*Measurement and Control ... of Laminated Magnetic Cores*", ASTM Bulletin, Jan. 1947, pp. 57-61.

*Primary Examiner*—Gerard R. Strecker
*Attorney, Agent, or Firm*—J. H. Beusse

[57] ABSTRACT

An improved Franklin tester for measuring surface insulation resistivity on magnetic sheets. The contact fingers of the prior art tester are modified to accommodate an articulated contact tip. The articulated tip pivots when the tester is clamped on a magnetic sheet to thereby maximize the area of contact. Preferably the articulated tips are formed of stainless steel to overcome the rapid deterioration of the prior brass contact fingers.

7 Claims, 6 Drawing Figures

CONTACT FINGERS FOR A TESTING APPARATUS FOR SURFACE INSULATION RESISTIVITY

BACKGROUND OF THE INVENTION

The present invention relates to testing equipment and, more particularly, to test equipment for measuring insulation characteristics of coatings on magnetic materials.

Transformers and motors depend upon flux carrying magnetic circuits for their operation. In a transformer, for example, the magnetic circuit is the core upon which the current carrying windings are wound. The alternating magnetic flux carried by the core transfers power from the input or primary winding to an output or secondary winding. The core or magnetic circuit for carrying alternating magnetic flux is typically built up of thin sheets of magnetic steel with electrical insulation between the sheets. This laminar construction reduces eddy current losses caused by induced electrical currents in the magnetic steel. Eddy current losses result in undesirable power loss or heat in the core material.

Although many types of electrical insulation are known, insulation used in cores of motors and transformers must be capable of withstanding the physical pressures and temperature stresses characteristic of these devices. Furthermore, the insulating material must be relatively thin in order to maximize the magnitude of magnetic steel in the magnetic circuit. In general the insulating material is a coating such as enamel, varnish or an oxide film which is applied to the surface of the steel sheets. The physical characteristics of this interlaminar insulating material and the uniformity of its application are very important since its failure can result in excessive eddy currents with high core losses and possibly localized high temperatures which can result in burning or fusing of the core laminations.

In January of 1947 an article by R. F. Franklin published in the ASTM Bulletin described an apparatus for measuring the electrical insulation characteristics of an insulative coating on magnetic steel. The apparatus has since become popularly known as a Franklin tester. Its description and utilization for testing insulation on magnetic steel is set forth in ASTM Standard A717-75 designated "Standard Method Of Test For Surface Insulation Resistivity Of Single Strip Specimens."

The Franklin tester comprises a contact member which is fastened to a head of a power press and a control box containing a volt-meter, an ammeter, and a regulated power supply. The contact member includes ten probes each terminating in a brass tipped contact, the contacts being forced against the surface to be measured by a spring. A current limiting resistor, usually 5 ohms in value, is connected in series with each contact to limit short-circuit current when the contact is placed against an uninsulated surface. The contacts and resistors are all connected to one terminal of the regulated power supply through the ammeter. The other terminal of the power supply is connected to the magnetic steel sheet being tested so that the resistors and contacts form a plurality of parallel circuits. The voltmeter is connected across the parallel circuits. The series resistances are selected such that for an applied voltage of ½ volt, an uninsulated surface will be subjected to a current flow of 1 ampere.

In operation the brass contacts are forced against an insulated steel sheet at a pressure which approximates the pressure within an operating magnetic core. The steel sheet may also be heated to simulate core operating conditions. The power supply is then adjusted until the voltmeter reads ½ volt and the current is read from the ammeter. A well insulated sheet will give a low current reading whereas a poorly insulated sheet will produce a reading approaching the 1 ampere calibration level.

During the thirty years in which the Franklin tester has been in use, there have been many instances in which insulation characteristics have been found satisfactory at the manufacturer's facility and unsatisfactory at the core assembly facility. In several instances cross checks of the readings on one Franklin tester with those taken by another Franklin tester have shown substantial disagreement. Tester users have assumed that the variations in readings result from mechanical deterioration, dirty contact tips, point-to-point variations in the characteristics of the insulative coating itself, or from electrical misadjustment during calibration. Mechanical deterioration may appear as a loss of parallelism between the probes thus resulting in a lack of perpendicularity between some of the probes and the steel sheet being tested. Since resistivity measurements depend upon uniform pressure and a constant contact surface area, such deterioration will result in inaccurate measurements.

One attempt to correct for mechanical deterioration has involved polishing the contact tips by placing an abrasive sheet, such as sandpaper, between the contact member and a support while under pressure and then pulling the abrasive sheet from under the contact member. Visual examination of the contact tips indicate a polishing action; however, this process has not resulted in correlated results between testers even when electrical adjustments are carefully and accurately performed.

OBJECT OF THE INVENTION

It is an object of the present invention to provide an improved Franklin tester.

It is another object of the present invention to provide an improved Franklin tester which automatically compensates for lack of parallelism between contact probes.

SUMMARY OF THE INVENTION

The present invention discloses a Franklin tester in which the elongated contact probes are fitted with articulated contact tips. Preferably the contact tips are formed of stainless steel to overcome the fast wear rate inherent in a brass contact surface. In one embodiment the contact tip is in the form of a cup which fits over the end of the contact probe. An indentation is formed in the end of the contact probe to establish a pocket for receiving a small steel ball. The cup-shaped contact tip is placed over the end of the contact probe capturing the ball in the indentation. The ball is sized to allow the bottom of the contact tip to ride on it thus giving articulation to the contact tip.

In an alternative embodiment a portion of the bottom of the cup-shaped contact tip is removed and a contact button positioned in the resultant opening. The button is held against the steel ball by a lip around the contact tip bottom. In this embodiment, the cup-shaped contact tip may be fixedly attached to the contact probe whereas in the previously described embodiment a somewhat loose attachment was utilized to allow some degree of articulation.

In a still further embodiment the contact probe is in the form of an elongated steel shaft terminating in a blunt point. A cup-shaped contact tip is fitted over the end of the shaft such that a small degree of articulation is provided. In this embodiment of the invention, the upper end of the steel shaft is supported in an insulated block in order to electrically isolate the plurality of contact probes.

DESCRIPTION OF THE DRAWINGS

The above and other objects and features of the invention will be better understood by reference to the following detailed description taken in conjunction with the accompanying drawings in which.

DETAILED DESCRIPTION

Figure 1:
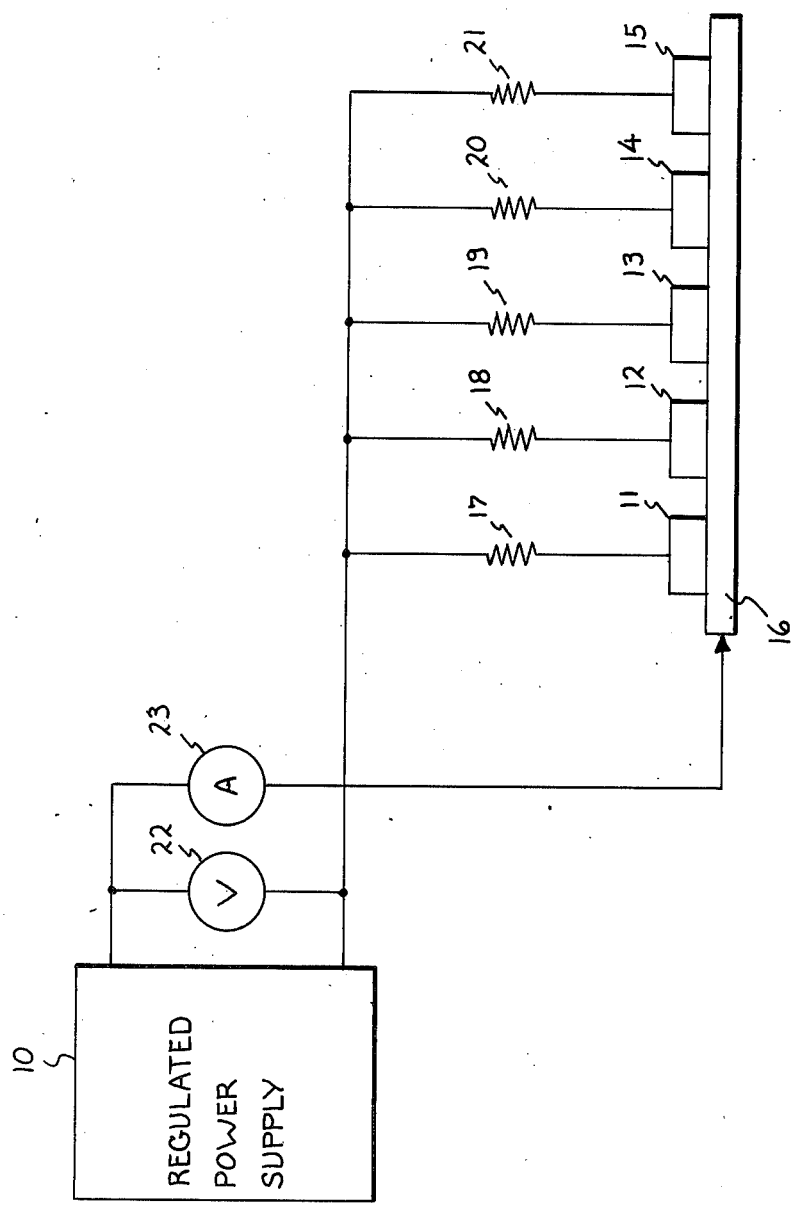
FIG. 1 is a simplified schematic diagram of a Franklin tester.

Referring now to FIG. 1, the schematic diagram for a Franklin tester includes a regulated power supply 10 connected to supply current at a regulated voltage to a plurality of contact probes 11, 12, 13, 14, and 15. Although illustrated as having only five contact probes, it will be appreciated that a standard tester commonly has ten probes. One output terminal of the power supply 10 is connected to a magnetic steel sheet 16 whose insulation resistance is desired to be measured. A second terminal of supply 10 is connected to each of the contact probes 11–15 via a corresponding resistor 17, 18, 19, 20, and 21 connected in series with each probe. A voltmeter 22 is connected between the two defined output terminals of power supply 10 for setting the voltage between these terminals to a desired value. An ammeter 23 is connected in a current supply line between power supply 10 and steel sheet 16 for measuring the magnitude of current passing through the insulating coating on sheet 16.

In the operation of the Franklin tester of FIG. 1, the power supply 10 is adjusted to a voltage which will cause a predetermined current, for example, one ampere, to flow when the insulation coating has zero resistivity. With that voltage applied, the resistivity of the coating on sheet 16 can be determined from the current reading on ammeter 23. A more detailed description of a Franklin tester and its operation is given in the aforementioned ASTM Standard A717.

Figure 2:
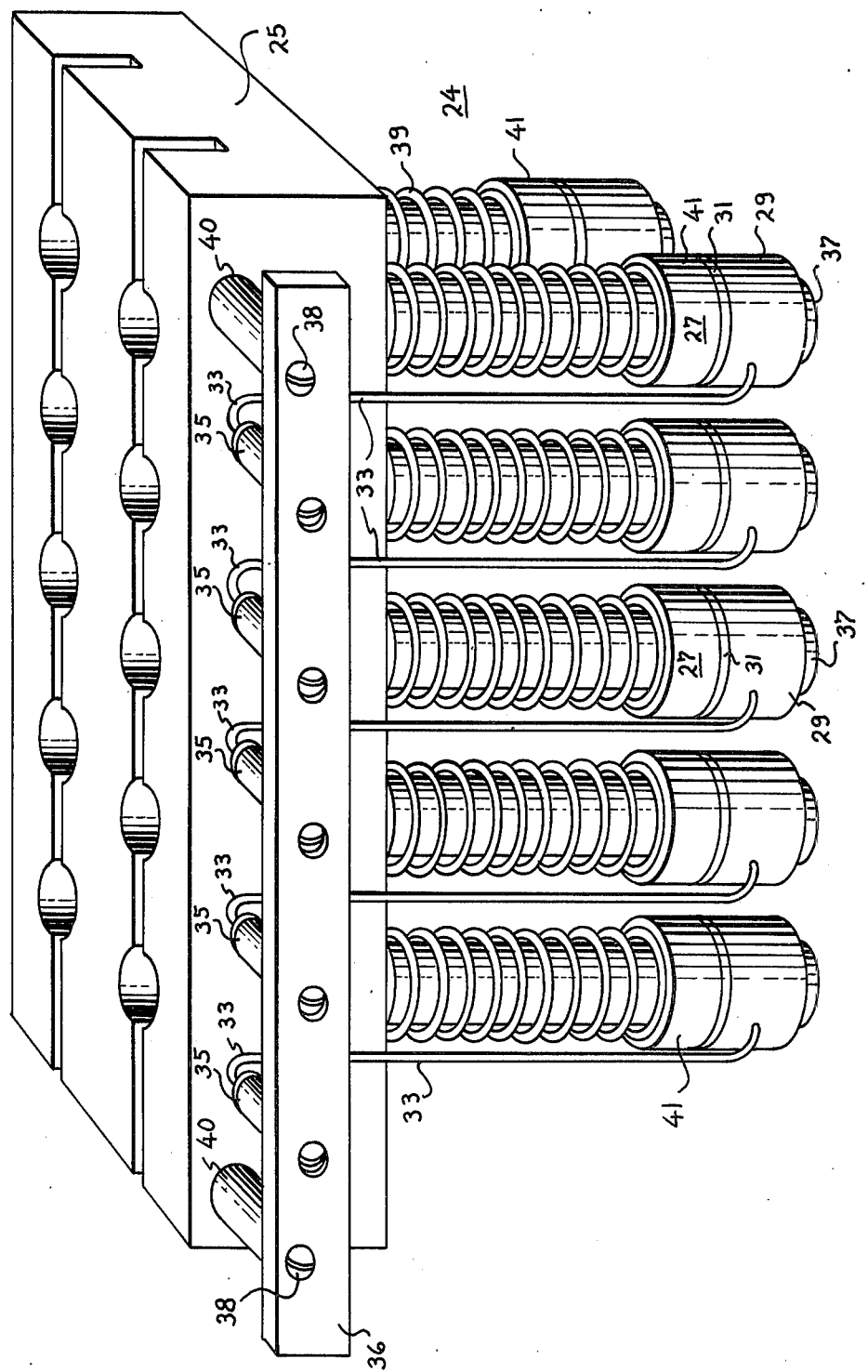
FIG. 2 is a simplified drawing of a contact carrying assembly for a prior art Franklin tester.

Referring to FIG. 2 there is illustrated a simplified contact head assembly 24 for a prior art Franklin tester. The assembly includes a steel mounting block 25 having a plurality of contact probes 27 protruding therefrom. Each of the probes 27 terminates in a brass contact tip 29. The contact tips 29 are insulated from the mounting block 25 by an insulative spacer 31. A plurality of leads 33 connect each of the contact tips 29 to a corresponding one of the resistors 35. Each of the resistors 35 has one end connected to a common bus (not shown). As shown in FIG. 1, the common bus may be connected to one terminal of a regulated power supply. Springs 39 mounted on the probe shaft exert a pressure between the mounting block 25 and a collar 41 on each of the probes thus biasing the contact tip 29 away from block 25. The springs 39 serve to transmit the clamping force applied to block 25 to the contact tips 29 while accommodating imperfections in the magnetic sheet being tested.

Each of the contact tips 29 terminate in a substantially flat contact surface. The contact surface is formed on the reduced diameter section 37 of contact tips 29. The ASTM test procedure for insulation resistivity specifies that the test be performed using a test probe having a one square inch surface area. Accordingly, the surface area of each of the tip sections 37 in a standard Franklin tester is 1/10 square inch.

The resistors 35 are attached to a support member 36 which is attached to mounting block 25 by means of screws 38 and spacers 40. A standard Franklin tester is constructed with fire resistors attached to each side of the block 25 to thus accommodate the necessary resistors 35 for ten probe members 27.

When a clamping force is applied between the contact head assembly 24 and a steel sheet whose insulation characteristics are to be measured, the brass contact tip sections 37 are intended to be pressed substantially flat against the steel sheet. However, because the probes 27 are spring mounted to the mounting block 25 and because of the rough treatment normally associated with such a tester, the probes 27 regularly lose parallelism. Thus, when pressure is exerted the brass tip sections 37 tend to be deformed and the pressure across the surface of each of the tip sections 37 becomes non-uniform. This variation in pressure leads to inaccurate measurements since resistivity is related to applied pressure. In addition, some of the insulative coatings used on the steel sheet the residue left from chemicals used in cleaning the coatings erode and pit the surface of the brass tip sections 37 thus affecting both the surface contact area and the uniformity of pressure over that area.

Figure 3:
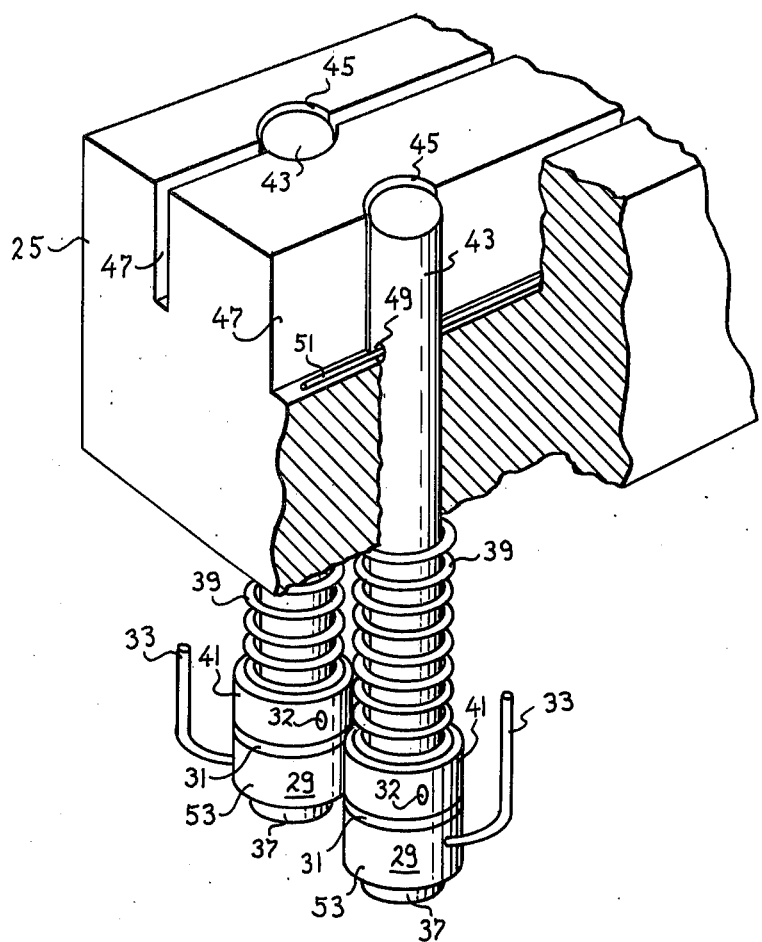
FIG. 3 is an enlarged view of a prior art contact probe.

An enlarged view of a representation of a contact probe 27 is shown in the partial cross-section view of FIG. 3. The probe 27 includes a shaft member 43 one end of which fits into an opening 45 in the mounting block 25. Two slots 47 are formed lengthwise of the block 25 intersecting each of the openings 45. A hole 49 through the end of each shaft member 43 accepts a pin 51 which is retained in the slot 47 and prevents the shaft member 43 from escaping in the direction of the spring force. The spring 39 mounted on each of the shaft members 43 exerts a force between the block 25 and the collar 41 on the shaft member 43 thus forcing each shaft member 43 to extend uniformly from the block 25.

The electrical insulating spacer 31 is attached to the collar 41 at the end of the shaft members 43. An adhesive may be used for attaching the spacer 31 and additional support provided by a swage pin 32 if the collar 41 is hollowed and a portion of spacer 31 fits into the hollowed out section. The contact tips 29 are attached to the spacers 31 thus electrically isolating the tips 29 from the shaft members 43 and block 25. A lead 33 from each contact tip 29 is connected to a corresponding one of the resistors 35.

The brass contact tips 29 of the prior art have a relatively large diameter section 53 and a smaller diameter section 37 at the tip. The surface area of the section 37 is defined in ASTM Standard A717 to be 1/10 square inch, i.e., the total surface area for all ten contact tips 29 is to be one square inch. This requirement of specific surface area is necessitated by the fact that resistivity measurements vary with surface area. Accordingly, it has been found that a failure of the contact tip sections 37 to be placed squarely on the surface to be tested will result in inaccurate measurements of resistivity.

Figure 4:
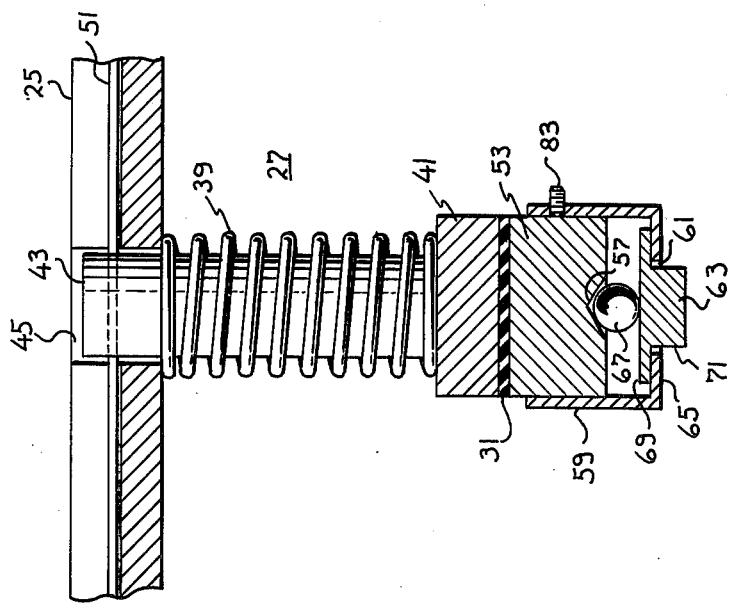
FIG. 4 is a cross-sectional view of one embodiment of a contact probe according to the present invention.

Referring to FIG. 4 there is shown a partial cross-sectional view of one embodiment of the present invention which assures full surface contact between a probe contact tip and a surface being tested. The probe 27 has been improved by removing the smaller tip section 37 and forming an indentation 57 in the surface of the larger tip section 52 on the axis of shaft member 27. A cup-shaped cap member 59 having a circular opening 61 formed in its bottom is pressed over the end of tip section 53 trapping a contact button 63 between a lip 65 of the opening 61 and the end of tip section 53. The button 63 rides on a steel ball 67 placed in the indentation 57. The button 63 has a larger diameter collar 69 which is captured by the lip 65 of member 59 and a smaller diameter portion 71 which protrudes through the opening 61 and forms the contact tip for the probe 27. Preferably the button 63 is of stainless steel construction to enhance its wearability.

As will be apparent, when the probe 27 is forced into contact with a magnetic sheet to be tested, the button 63 has a degree of freedom allowing it to pivot or articulate about the central axis of the probe 27 by virtue of riding on the ball 67. Thus a small loss of parallelism between the probes 27 will not result in a reduction in surface contact area. Rather, the contact tip button 63 will pivot about the ball 67 so that the contact surface is maximized.

Although the embodiment of the invention shown in FIG. 4 is a workable embodiment, the close proximity of the probes 27 requires that the member 59 be a very thin walled material.

Figure 5:
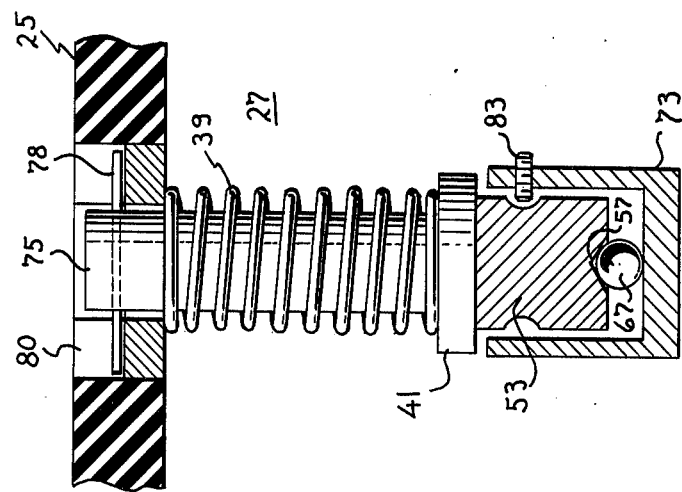
FIG. 5 is a cross-sectional view of a modification of the contact probe of FIG. 4.

Referring to FIG. 5 there is shown an alternate embodiment in which the cross-sectional area of the contact section 53 has been reduced. A cup-shaped cap member 73 fits over the section 53 and rides on the steel ball 67 which is captured in indentation 57. The reduced cross-sectional area of the contact section 53 is such that the surface area of the face of the cap member 73 is the same as the surface area of the button 63 of FIG. 4. Accordingly, the button 63 is eliminated from the embodiment of FIG. 5. The cap member 73 is held loosely on shaft 75 by a set screw 76.

It will be noted that the probe shaft of FIG. 5 has been modified to eliminate the need for an insulating spacer 31 at the probe tip. The shaft 75 is a continuous steel shaft from the indentation 57 to the mounting block 25. In order to electrically isolate the individual probes 27, the mounting block 25 is constructed from an electrically insulating material such as, for example, a fiber filled phenolic resin material. For structural strength, a steel sleeve 80 is forced into the shaft opening 77 with the shaft and then sliding within the sleeve 80. The pin 51 has been replaced by a plurality of short pins 78 each associated with a single probe shaft 75 in order to maintain electrical isolation between the probes 27.

Figure 6:
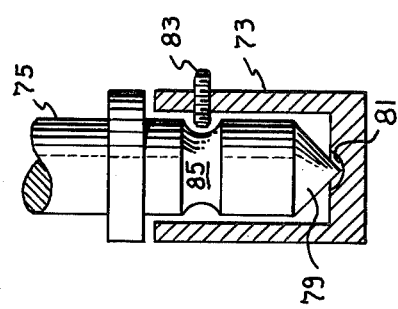
FIG. 6 is a further embodiment of a contact probe incorporating the teaching of the present invention.

FIG. 6 is a further embodiment of the invention illustrated in FIG. 5, which eliminates the steel ball 67. The shaft 75 is formed with a rounded, slightly pointed tip 79. A corresponding depression 81 is formed in the inside center of the bottom of cup-shaped cap member 73. When the cap member 73 is placed over the end of shaft 75, the cap member 73 rides on the tip 79 and can thus pivot to accommodate a reasonable lack of perpendicularity between the probes 27 and a surface being tested. The cap member 73 can be retained in place by a set screw 83 loosely screwed through the cap member 73 and engaging a groove 85 formed circumferentially of the shaft 75. Preferably, the cap member 73 is constructed of a stainless steel material to enhance its wearability and to overcome the deformation problems associated with a brass contact tip.

From the foregoing it will be appreciated that the present invention has identified and provided a solution for a long standing problem with regard to the lack of reproducibility and accuracy of measurements using Franklin testers. The invention replaces the prior fixed contact probe tips with articulated tips which allow the probes to automatically compensate for lack of perpendicularity between the probe and a steel sheet under test. The former brass tips have been replaced with stainless steel tips to improve wearability and to avoid etching of the probe tip by the steel coating material.

While the principals of the invention have now been made clear in illustrative embodiments, there will be obvious to those skilled in the art other modifications which are particularly adapted for specific applications. The appended claims are therefore intended to cover and embrace such modifications, subject only to the true spirit and scope of the invention.

What I claim as new and desire to secure by Letters Patent of the United States is:

1. An apparatus for testing the electrical insulation characteristics of an insulative coating on a magnetic material, the apparatus including a mounting block carrying a plurality of probe assemblies, each probe assembly terminating in a substantially flat contact surface, means for biasing the contact surface of each of the probe assemblies into contact with the magnetic material by exerting a predetermined clamping force between the magnetic material and the mounting block, means for applying a predetermined voltage potential between each of the contact surfaces and the magnetic material and means for measuring the current flow through the insulative coating to thereby determine its effective insulation characteristics, an improved probe assembly comprising:

(a) shaft means having a first end and a second end, said first end being slidably engaged in the mounting block;

(b) a contact member having a substantially flat contact surface, said contact member being loosely attached to said second end of said shaft means such that said contact surface can tilt relative to a plane normal to the axis of said shaft means;

(c) biasing means mounted on said shaft means and adapted for transmitting said clamping force from said mounting block to said second end of said shaft means; and (d) pivot means disposed between said contact member and said shaft means for transmitting the clamping force on the second end to a relatively small area of said contact member, said small area being centered with respect to said contact surface whereby said contact surface pivots under pressure to maximize the area of contact between said contact surface and the magnetic material;

(e) said contact member comprising a cup-shaped cap member adapted for fitting over said second end of said shaft means, the outside bottom surface of said cap member forming the contact surface.

2. The apparatus of claim 1 and including a depression formed in the inside surface at the center of the bottom of said cap member for mating with said pivot means whereby pressure is applied to a relatively small central area of said contact surface.

3. The apparatus of claim 1 wherein said contact member comprises:
   (a) a cup-shaped cap member having an opening formed in the bottom thereof; and
   (b) button means positioned in said opening, said button means having a small diameter section protruding through said opening with the contact surface formed on an outer flat surface thereof, and a larger diameter collar on said button adapted for restraining said button means within said cap member, said button means riding on said pivot means whereby pressure on the contact surface causes said button means to pivot thereby maximizing the contact area of the contact surface.

4. The apparatus of claim 1 wherein said pivot means comprises:
   (a) an indentation formed in the second end of said shaft means, said indentation being centered on the axis of said shaft means; and
   (b) ball means adapted for fitting into said indentation and having a surface thereof protruding from said indentation.

5. The apparatus of claim 1 wherein said pivot means comprises a rounded point formed on said second end of said shaft means.

6. The apparatus of claim 1 wherein said shaft means comprises a metallic rod and the mounting block is constructed of an electrical insulating material.

7. The apparatus of claim 1 wherein said contact member is constructed from stainless steel.

* * * * *